(12) United States Patent
Wei et al.

(10) Patent No.: US 8,816,409 B2
(45) Date of Patent: Aug. 26, 2014

(54) METAL-OXIDE SEMICONDUCTOR TRANSISTOR

(75) Inventors: Ming-Te Wei, Changhua County (TW);
Wen-Chen Wu, Kaohsiung (TW);
Lung-En Kuo, Tainan County (TW);
Po-Chao Tsao, Taipei Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 321 days.

(21) Appl. No.: 12/837,475

(22) Filed: Jul. 15, 2010

(65) Prior Publication Data

US 2012/0012904 A1 Jan. 19, 2012

(51) Int. Cl.
| | | |
|---|---|---|
| *H01L 21/00* | (2006.01) | |
| *H01L 29/165* | (2006.01) | |
| *H01L 21/8238* | (2006.01) | |
| *H01L 29/66* | (2006.01) | |
| *H01L 29/78* | (2006.01) | |

(52) U.S. Cl.
CPC ...... *H01L 29/165* (2013.01); *H01L 21/823807* (2013.01); *H01L 21/823828* (2013.01); *H01L 21/823864* (2013.01); *H01L 29/6656* (2013.01); *H01L 29/66575* (2013.01); *H01L 29/66636* (2013.01); *H01L 29/7834* (2013.01); *H01L 29/7848* (2013.01)
USPC .............................. 257/288; 257/408; 257/77

(58) Field of Classification Search
CPC ..................... H01L 29/6656; H01L 29/66621; H01L 29/6653; H01L 29/66636
USPC ........................................... 257/288, 408, 77
See application file for complete search history.

(56) References Cited

U.S. PATENT DOCUMENTS

| | | | | |
|---|---|---|---|---|
| 5,885,761 A | * | 3/1999 | Duane et al. .................. | 438/564 |
| 6,043,116 A | * | 3/2000 | Kuo ............................. | 438/233 |
| 6,121,080 A | * | 9/2000 | Wu .............................. | 438/238 |
| 6,133,151 A | * | 10/2000 | Lin .............................. | 438/694 |
| 6,153,457 A | * | 11/2000 | Kuo ............................. | 438/233 |
| 6,534,414 B1 | | 3/2003 | Wang | |
| 6,846,618 B2 | | 1/2005 | Hsu | |
| 7,176,522 B2 | * | 2/2007 | Cheng et al. .................. | 257/338 |
| 7,183,156 B2 | * | 2/2007 | Goldbach et al. ............. | 438/248 |
| 7,482,656 B2 | * | 1/2009 | Luo et al. ...................... | 257/347 |
| 7,498,264 B2 | * | 3/2009 | Mehard et al. ................ | 438/692 |
| 7,611,938 B2 | * | 11/2009 | Cheng et al. .................. | 438/199 |
| 7,670,914 B2 | * | 3/2010 | Krivokapic ................... | 438/300 |
| 7,678,690 B2 | * | 3/2010 | Richter et al. ................ | 438/634 |
| 7,709,275 B2 | | 5/2010 | Yang et al. | |
| 7,745,847 B2 | * | 6/2010 | Tseng et al. .................. | 257/190 |
| 7,767,534 B2 | * | 8/2010 | Yang et al. .................... | 438/299 |
| 7,812,399 B2 | * | 10/2010 | Yuda ............................. | 257/369 |
| 8,076,194 B2 | * | 12/2011 | Tseng et al. .................. | 438/229 |
| 8,076,209 B2 | * | 12/2011 | Yang et al. .................... | 438/299 |
| 8,227,890 B2 | * | 7/2012 | Lin et al. ....................... | 257/529 |
| 2002/0061625 A1 | * | 5/2002 | Wang et al. ................... | 438/301 |

(Continued)

*Primary Examiner* — Laura Menz
(74) *Attorney, Agent, or Firm* — Winston Hsu; Scott Margo

(57) ABSTRACT

A method for fabricating a metal-oxide semiconductor (MOS) transistor is disclosed. The method includes the steps of: providing a semiconductor substrate; forming a silicon layer on the semiconductor substrate; performing a first photo-etching process on the silicon layer for forming a gate pattern; forming an epitaxial layer in the semiconductor substrate adjacent to two sides of the gate pattern; and performing a second photo-etching process on the gate pattern to form a slot in the gate pattern while using the gate pattern to physically separate the gate pattern into two gates.

5 Claims, 3 Drawing Sheets

(56) References Cited

U.S. PATENT DOCUMENTS

| | | | |
|---|---|---|---|
| 2002/0137296 A1* | 9/2002 | Satoh et al. | 438/301 |
| 2002/0140020 A1* | 10/2002 | Wu et al. | 257/306 |
| 2005/0030697 A1* | 2/2005 | Wu et al. | 361/301.4 |
| 2005/0112817 A1* | 5/2005 | Cheng et al. | 438/219 |
| 2005/0116293 A1* | 6/2005 | Goldbach et al. | 257/349 |
| 2006/0046407 A1* | 3/2006 | Juengling | 438/301 |
| 2006/0105561 A1* | 5/2006 | Huh | 438/618 |
| 2006/0189080 A1* | 8/2006 | Lee et al. | 438/261 |
| 2006/0258109 A1* | 11/2006 | Juengling | 438/301 |
| 2007/0128786 A1* | 6/2007 | Cheng et al. | 438/199 |
| 2007/0202653 A1* | 8/2007 | Hoentschel et al. | 438/301 |
| 2007/0278591 A1* | 12/2007 | Luo et al. | 257/374 |
| 2008/0048217 A1* | 2/2008 | Kim et al. | 257/288 |
| 2008/0090360 A1* | 4/2008 | Krivokapic | 438/283 |
| 2008/0224212 A1* | 9/2008 | Lee et al. | 257/344 |
| 2009/0186475 A1* | 7/2009 | Ting et al. | 438/595 |
| 2010/0012999 A1* | 1/2010 | Park | 257/324 |
| 2010/0081245 A1* | 4/2010 | Yang et al. | 438/299 |
| 2010/0109045 A1* | 5/2010 | Liu et al. | 257/190 |
| 2010/0210084 A1* | 8/2010 | Yang et al. | 438/285 |
| 2010/0227445 A1* | 9/2010 | Tseng et al. | 438/229 |
| 2011/0147853 A1* | 6/2011 | Lin et al. | 257/379 |
| 2011/0230027 A1* | 9/2011 | Kim et al. | 438/285 |
| 2012/0012904 A1* | 1/2012 | Wei et al. | 257/288 |
| 2012/0043614 A1* | 2/2012 | Choi et al. | 257/369 |
| 2012/0045873 A1* | 2/2012 | Jeong et al. | 438/198 |
| 2012/0045880 A1* | 2/2012 | Ma et al. | 438/287 |
| 2012/0056245 A1* | 3/2012 | Kang et al. | 257/192 |
| 2012/0104514 A1* | 5/2012 | Park et al. | 257/411 |
| 2012/0181625 A1* | 7/2012 | Kwok et al. | 257/408 |

* cited by examiner

US 8,816,409 B2

METAL-OXIDE SEMICONDUCTOR TRANSISTOR

BACKGROUND OF THE INVENTION

1. Field of the Invention

The invention relates to a method for fabricating MOS transistor, and more particularly, to a method of defining polysilicon slot before formation of epitaxial layer.

2. Description of the Prior Art

In the field of semiconductor fabrication, the use of polysilicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

As the dimension of semiconductor devices decreases, the fabrication of transistors also improves substantially for fabricating small size and high quality transistors. Conventional approach of fabricating the gate of metal-oxide semiconductor (MOS) transistors typically forms a polysilicon layer on a semiconductor substrate and a hard mask on the polysilicon layer before using two photo-etching processes (PEP) to pattern the polysilicon layer and the hard mask into a gate of the transistor. Preferably, the first photo-etching process is conducted to pattern the hard mask and the polysilicon layer into a plurality of rectangular polysilicon gate pattern as the second photo-etching process forms a polysilicon slot in each of the rectangular gate pattern for separating each gate pattern into two gates. Thereafter, elements including spacers are formed on the sidewall of the gate and lightly doped drains and epitaxial layer are formed in the semiconductor substrate adjacent to two sides of the spacer.

However, as the polysilicon slot is preferably formed before the formation of epitaxial layer, the etching ratio involved during the formation of the polysilicon slot typically affects the process thereafter. For instance, if the etching ratio of the second photo-etching process is low, the gate pattern would not be etched through completely to form the polysilicon slot and phenomenon such as polysilicon residue and line end bridge would result, whereas if the etching ratio of the second photo-etching process is high, the hard mask disposed on top of the polysilicon gate pattern would be consumed, which would further induce consumption of the spacer formed on the sidewall of the gate thereafter. As some of the spacer on the sidewall is consumed away, a portion of the gate is exposed and un-wanted epitaxial layer would be formed on the exposed portion of the gate.

SUMMARY OF THE INVENTION

It is an objective of the present invention to provide a method for fabricating a MOS transistor for resolving the aforementioned issue caused by conventional approach.

According to a preferred embodiment of the present invention, a method for fabricating a metal-oxide semiconductor (MOS) transistor is disclosed. The method includes the steps of: providing a semiconductor substrate; forming a silicon layer on the semiconductor substrate; performing a first photo-etching process on the silicon layer for forming a gate pattern; forming an epitaxial layer in the semiconductor substrate adjacent to two sides of the gate pattern; and performing a second photo-etching process on the gate pattern to form a slot in the gate pattern while using the gate pattern to physically separate the gate pattern into two gates.

According to another aspect of the present invention, a metal-oxide semiconductor (MOS) transistor is disclosed. The MOS transistor includes: a semiconductor substrate; a gate disposed on the semiconductor substrate, wherein the gate comprises four sidewalls, and two of the four sidewalls opposite to each other comprise a spacer thereon while the other two sidewalls opposite to each other comprise no spacer; and an epitaxial layer disposed in the semiconductor substrate adjacent to two sides of the spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
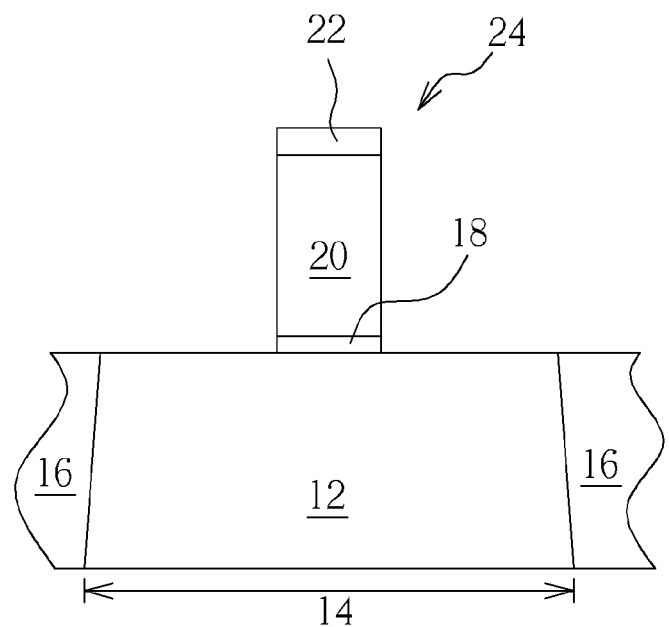
FIGS. 1-6 illustrate a method for fabricating a MOS transistor according to a preferred embodiment of the present invention.

Referring to FIGS. 1-6, FIGS. 1-6 illustrate a method for fabricating a MOS transistor according to a preferred embodiment of the present invention. As shown in FIG. 1, a semiconductor substrate 12, such as a silicon substrate or a silicon-on-insulator (SOI) substrate is provided. At least an active region 14 is defined on the semiconductor substrate 12 and a plurality of shallow trench isolations (STI) 16 are formed for separating the active region 14 from adjacent regions or devices.

A gate insulating layer (not shown) composed of dielectric material such as oxides or nitrides is deposited on surface of the semiconductor substrate 12, and a polysilicon layer preferably with a depth of approximately 1000 Angstroms and a hard mask are formed sequentially on the gate insulating layer thereafter. In this embodiment, the hard mask could be selected from a material consisting of $SiO_2$, silicon nitride, and SiON, and the polysilicon layer could be composed of undoped polysilicon material or polysilicon with N+ dopants, which are all within the scope of the present invention.

Next, a photo-etching process is performed on the hard mask and the polysilicon layer by first forming a patterned photoresist (not shown) on the hard mask and then using the photoresist as mask to carry out a patterning process. The patterning process preferably removes a portion of the hard mask, the polysilicon layer and the gate insulating layer through a single or multiple etching to form a gate pattern 24 composed of patterned gate insulating layer 18, patterned polysilicon layer 20, and patterned hard mask 22 in the active region 14. The patterned photoresist is removed subsequent to the patterning process.

Figure 2:

Next, as shown in FIG. 2, FIG. 2 illustrates a top view of the gate formed after the first photo-etching process. As shown in the figure, a plurality of rectangular gate patterns 24 are formed on the semiconductor substrate 12 after the aforementioned first photo-etching process, in which each gate pattern 24 is composed of a patterned gate insulating layer 18, a patterned gate polysilicon layer 20, and a patterned hard mask 22.

Figure 3:
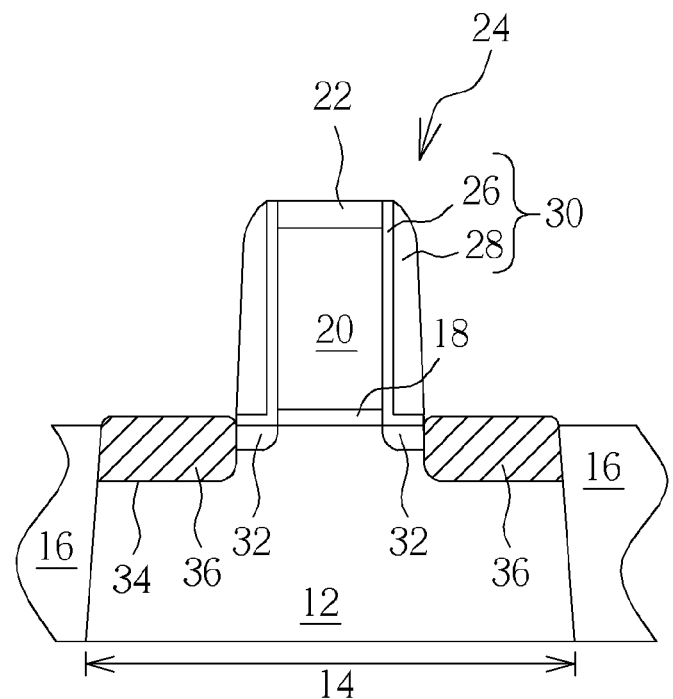

As shown in FIG. 3, a first stage spacer formation is conducted by first depositing a silicon oxide layer (not shown) and a silicon nitride layer (not shown) on the semiconductor substrate 12. An etching back is carried thereafter to remove a portion of the silicon oxide layer and silicon nitride layer to form a first spacer 30 composed of silicon oxide layer 26 and silicon nitride layer 28 on the sidewall of the gate pattern 24.

Next, a selective epitaxial growth (SEG) process is performed to form a strained silicon in the semiconductor substrate 12. For instance, a patterned photoresist (not shown) could be formed on the semiconductor substrate, and an etching process is conducted to form two recesses 34 in the semiconductor substrate 12 adjacent to two sides of the gate pattern 24. A surface clean is carried out thereafter to completely remove native oxides or other impurities from the surface of the recesses 34. Next, a selective epitaxial growth process is performed to substantially fill the two recesses 34 for forming an epitaxial layer 36. Preferably, a light ion implantation could be conducted before the formation of the first spacer 30 and the epitaxial layer 36 to implant n-type or p-type dopants into the semiconductor substrate 12 adjacent to two sides of the gate pattern 24 for forming a lightly doped drain 32, and the material of the epitaxial layer 36 could be selected according to the type of the transistor or demand of the product.

For instance, if the transistor fabricated were to be a PMOS transistor, an epitaxial layer 36 composed of silicon germanium is preferably formed in the recesses 34 to provide a compressive strain to the channel region of the PMOS transistor thereby increasing the hole mobility of the transistor. Conversely, if the transistor fabricated were to be a NMOS transistor, an epitaxial layer composed of silicon carbide (SiC) is preferably formed in the recesses 34 to provide a tensile strain to the channel region of the NMOS transistor for increasing the electron mobility of the transistor.

Figure 4:
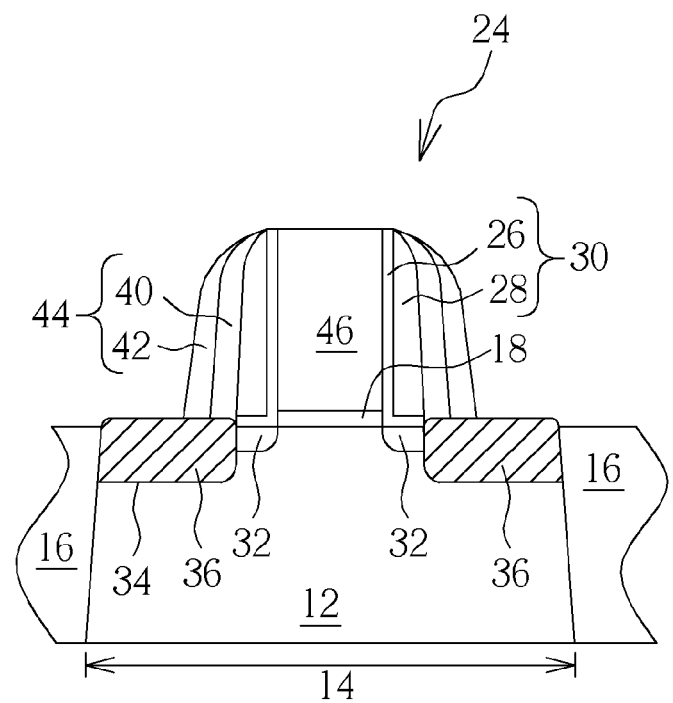
Figure 5:
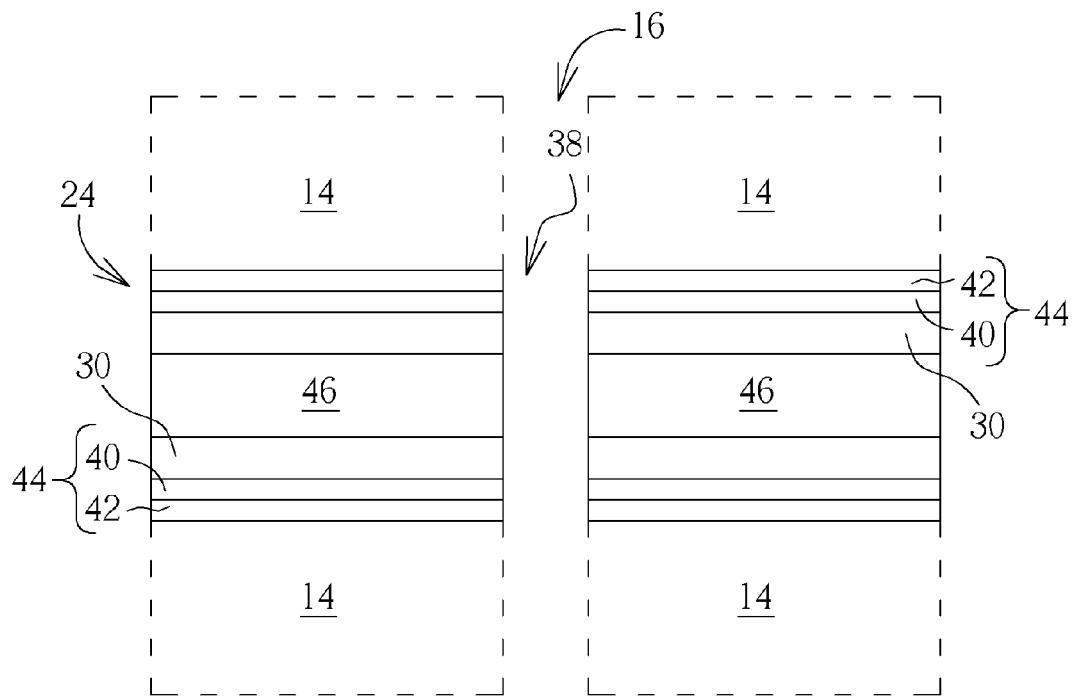

Referring now to FIGS. 4 and 5, FIG. 4 illustrates a cross-sectional view of the gate pattern after FIG. 3 and FIG. 5 illustrates a top view of the gate according to this embodiment. As shown in the figures, the hard mask 22 disposed on top of the polysilicon layer 20 is removed, and a spacer material layer, such as a silicon oxide layer (not shown) and a silicon nitride layer (not shown) are deposited sequentially on the semiconductor substrate 12. A photo-etching process is then carried out by first forming a patterned photoresist (not shown) on the polysilicon layer 20 and performing an etching process by using the patterned photoresist as mask to remove the polysilicon layer 20 on top of the shallow trench isolation 16, such as a part of the two ends and central portion of the polysilicon layer 20 for forming at least a polysilicon slot 38 in the rectangular gate pattern 24. The polysilicon slot 38 preferably separates the gate pattern 24 into two independent gates 46. After stripping the patterned photoresist and cleaning off remaining particles from the surface of the semiconductor substrate 12, an etching back is conducted on the deposited silicon oxide layer (not shown) and silicon nitride layer (not shown) for forming a second spacer 44 composed of silicon oxide layer 40 and silicon nitride layer 42 on the sidewall of the gate 46.

For simplification purpose, only one gate pattern 24 is revealed in FIG. 5 and other doping regions including lightly doped drain and epitaxial layers are also omitted. As shown in the figure, the polysilicon slot 38 preferably divides the gate pattern 24 into two independent portions, and as part of the silicon oxide layer 40 and silicon nitride layer 42 is removed for forming the polysilicon slot 38 and separating the gate pattern 24, no spacer is formed on at least two opposite sidewalls of the gate 46 after the separation. In other words, a second spacer 44 composed of silicon oxide layer 40 and silicon nitride layer 42 is formed on two opposite sidewalls of the polysilicon gate 46, whereas the other two remaining opposite sidewall contain no spacer.

Preferably, the polysilicon slot 38 is formed after the removal of the hard mask to facilitate a rework process conducted afterwards. For instance, a rework is typically carried out during a lithography for forming the polysilicon slot 38, and as the hard mask 22 is removed from the active region 14 of the semiconductor substrate 12 before rework is carried out, the exposed silicon substrate surface becomes unprotected. Unfortunately, reacting gas such as oxygen used to remove photoresist material during rework typically accumulates native oxides on the surface of the substrate or forms recesses on the substrate. Hence, the present embodiment preferably removes the hard mask 22 from the polysilicon layer 20 and then deposits the aforementioned silicon oxide and silicon nitride layer on the substrate 12. These deposited silicon oxide and silicon nitride layer could not only be used as material layers for forming the second spacer, but also be used as etching mask for forming the polysilicon slot and protecting the active region.

In addition to forming the polysilicon slot after removing the hard mask, as addressed in the above embodiment, the polysilicon slot 38 could also be formed at any point after the epitaxial layer 36 is formed, which is within the scope of the present invention.

Moreover, the above embodiment of forming the second spacer preferably forms a silicon oxide layer and a silicon nitride layer before the etching back process, and then using one single etching back to simultaneously remove a portion of the silicon oxide layer and silicon nitride layer for forming the second spacer. However, the present invention could also deposit a single silicon oxide layer before the polysilicon slot is formed, and then deposit a silicon nitride layer after the formation of the polysilicon slot to form different MOS transistor structures.

Figure 6:
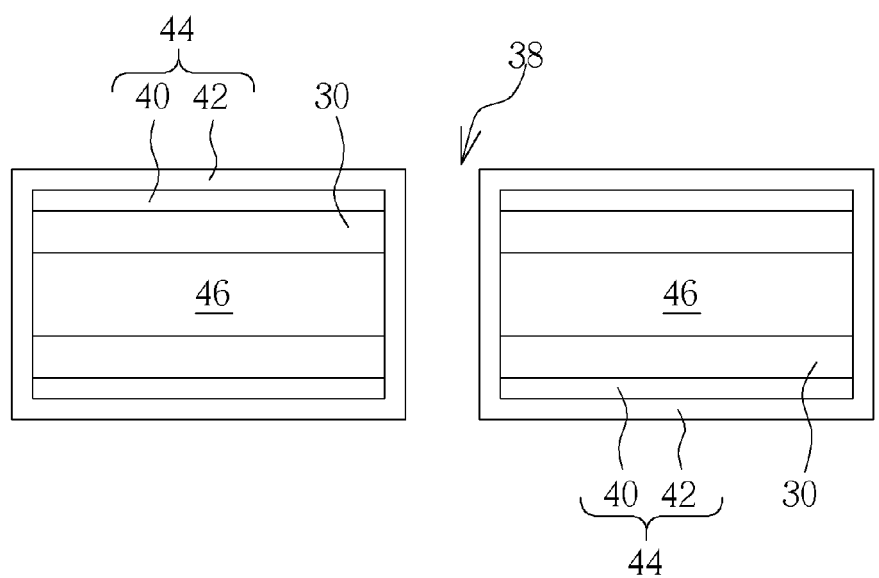

For instance, a silicon oxide layer 40 could be deposited on the semiconductor substrate 12 after removing the hard mask, and after following the aforementioned step for forming the polysilicon slot 38, a silicon nitride layer 42 is deposited on the substrate 12, and a portion of the silicon oxide layer 40 and silicon nitride layer 42 are removed through etching back process to form the second spacer 44. As shown in FIG. 6, as part of the silicon oxide layer 40 is removed during the formation of the polysilicon slot 38, the silicon oxide layer 40 of the second spacer 44 would only be disposed on two opposite sidewall of the gate, and as the silicon nitride layer 42 of the second spacer 44 is deposited after the formation of the polysilicon slot 38, the silicon nitride layer 42 is preferably formed on four sidewalls of the gate 46.

According to another embodiment of the present invention, a silicon oxide layer 40 could be deposited on the semiconductor substrate 12 after removing the hard mask, and after following the aforementioned approach for forming the polysilicon slot 38, an etching back is carried out to remove a portion of the silicon oxide layer 40 for forming a second spacer, and then depositing a silicon nitride layer 42 on the substrate 12, and then performing another etching back to remove part of the silicon nitride layer 42 for forming a third spacer. Despite the fabrication sequence of this embodiment is slightly different from the above approach, the same transistor structure as disclosed in FIG. 6 could be fabricated.

In contrast to the conventional approach of forming polysilicon slot before the epitaxial layer, the present invention uses a first photo-etching process to define a rectangular polysilicon gate pattern, forms an epitaxial layer adjacent to two sides of the gate pattern, and then uses a second photo-etching process to define the polysilicon slot while separating the gate pattern into two gates. As the definition of the polysilicon slot is carried after the formation of the epitaxial layer, issues such as line end bridge of epitaxial layer and growth of epitaxial layer on sidewall of the gate could be prevented substantially.

Those skilled in the art will readily observe that numerous modifications and alterations of the device and method may be made while retaining the teachings of the invention.

What is claimed is:

1. A metal-oxide semiconductor (MOS) transistor, comprising:
    a semiconductor substrate including a shallow trench isolation;
    a first photo-etched layer comprising a gate disposed on the semiconductor substrate,
    wherein the gate comprises four sidewalls, and two of the four sidewalls opposite to each other comprise a spacer thereon while the other two sidewalls opposite to each other comprise no said spacer, wherein the gate is of a rectangular shape and has a second photo-etched slot directly formed on one sidewall of the gate and exposing the shallow trench isolation, of which no spacer is disposed thereon;
    a recess in the semiconductor substrate adjacent two sides of the spacers; and
    an epitaxial layer disposed in the recess in the semiconductor substrate adjacent to two sides of the spacer; and
    wherein the second photo-etched slot is formed without a line end bridge.

2. The MOS transistor of claim 1, wherein the spacer comprises a first spacer and a second spacer.

3. The MOS transistor of claim 2, wherein each of the first spacer and the second spacer comprises silicon oxide and silicon nitride.

4. The MOS transistor of claim 1, wherein the epitaxial layer comprises silicon germanium or silicon carbide.

5. The MOS transistor of claim 1, wherein the slot is not on top of an active region.

* * * * *